United States Patent
Cok et al.

(10) Patent No.: US 10,396,137 B2
(45) Date of Patent: Aug. 27, 2019

(54) TESTING TRANSFER-PRINT MICRO-DEVICES ON WAFER

(71) Applicant: X-Celeprint Limited, Cork (IE)

(72) Inventors: Ronald S. Cok, Rochester, NY (US); Christopher Andrew Bower, Raleigh, NC (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/915,711

(22) Filed: Mar. 8, 2018

(65) Prior Publication Data

US 2018/0261658 A1    Sep. 13, 2018

Related U.S. Application Data (60) Provisional application No. 62/469,906, filed on Mar. 10, 2017.

(51) Int. Cl.
*H01L 27/32* (2006.01)
*G01R 31/28* (2006.01)

(52) U.S. Cl.
CPC .......... *H01L 27/3255* (2013.01); *G01R 31/28* (2013.01); *H01L 27/3248* (2013.01)

(58) Field of Classification Search
CPC .. H01L 27/3255; H01L 27/3248; G01R 31/28
See application file for complete search history.

(56) References Cited

U.S. PATENT DOCUMENTS

| | | |
|---|---|---|
| 5,550,066 A | 8/1996 | Tang et al. |
| 5,621,555 A | 4/1997 | Park |
| 5,815,303 A | 9/1998 | Berlin |
| 5,994,722 A | 11/1999 | Averbeck et al. |

(Continued)

FOREIGN PATENT DOCUMENTS

| | | |
|---|---|---|
| WO | WO-2006/027730 A1 | 3/2006 |
| WO | WO-2006/099741 A1 | 9/2006 |

(Continued)

OTHER PUBLICATIONS

Bower, C. A. et al., Transfer Printing: An Approach for Massively Parallel Assembly of Microscale Devices, IEE, Electronic Components and Technology Conference, (2008).

(Continued)

*Primary Examiner* — Zandra V Smith
*Assistant Examiner* — Andre C Stevenson
(74) *Attorney, Agent, or Firm* — William R. Haulbrook; Michael D. Schmitt; Choate, Hall & Stewart LLP (57) ABSTRACT

A method of making and testing transfer-printable micro-devices on a source wafer includes providing a source wafer comprising a plurality of sacrificial portions spatially separated by anchors, the source wafer comprising one or more test contact pads, providing a micro-device entirely over each of the plurality of sacrificial portions, each micro-device physically connected to at least one anchor with one or more tethers, providing one or more electrical test connections from each micro-device to a corresponding test contact pad, testing the micro-devices through the test connections to determine functional micro-devices and faulty micro-devices, and removing at least a portion of the one or more test connections.

18 Claims, 6 Drawing Sheets

(56) References Cited

U.S. PATENT DOCUMENTS

| | | |
|---|---|---|
| 6,025,730 A | 2/2000 | Akram et al. |
| 6,084,579 A | 7/2000 | Hirano |
| 6,142,358 A | 11/2000 | Cohn et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,392,340 B2 | 5/2002 | Yoneda et al. |
| 6,466,281 B1 | 10/2002 | Huang et al. |
| 6,577,367 B2 | 6/2003 | Kim |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,828,724 B2 | 12/2004 | Burroughes |
| 6,876,212 B2 * | 4/2005 | Fjelstad ............ G01R 1/0491 324/754.07 |
| 6,933,532 B2 | 8/2005 | Arnold et al. |
| 6,969,624 B2 | 11/2005 | Iwafuchi et al. |
| 7,012,382 B2 | 3/2006 | Cheang et al. |
| 7,091,523 B2 | 8/2006 | Cok et al. |
| 7,098,589 B2 | 8/2006 | Erchak et al. |
| 7,127,810 B2 | 10/2006 | Kasuga et al. |
| 7,129,457 B2 | 10/2006 | McElroy et al. |
| 7,195,733 B2 | 3/2007 | Rogers et al. |
| 7,259,391 B2 | 8/2007 | Liu et al. |
| 7,288,753 B2 | 10/2007 | Cok |
| 7,354,801 B2 | 4/2008 | Sugiyama et al. |
| 7,402,951 B2 | 7/2008 | Cok |
| 7,420,221 B2 | 9/2008 | Nagai |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,622,367 B1 | 11/2009 | Nuzzo et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,893,612 B2 | 2/2011 | Cok |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,029,139 B2 | 10/2011 | Ellinger et al. |
| 8,039,847 B2 | 10/2011 | Nuzzo et al. |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,558,243 B2 | 10/2013 | Bibl et al. |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,835,940 B2 | 9/2014 | Hu et al. |
| 8,854,294 B2 | 10/2014 | Sakariya |
| 8,860,051 B2 | 10/2014 | Fellows et al. |
| 8,865,489 B2 | 10/2014 | Rogers et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,902,152 B2 | 12/2014 | Bai et al. |
| 8,941,215 B2 | 1/2015 | Hu et al. |
| 8,946,760 B2 | 2/2015 | Kim |
| 8,987,765 B2 | 3/2015 | Bibl et al. |
| 9,105,714 B2 | 8/2015 | Hu et al. |
| 9,111,464 B2 | 8/2015 | Bibl et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,166,114 B2 | 10/2015 | Hu et al. |
| 9,178,123 B2 | 11/2015 | Sakariya et al. |
| 9,202,996 B2 | 12/2015 | Orsley et al. |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,358,775 B2 | 6/2016 | Bower et al. |
| 9,367,094 B2 | 6/2016 | Bibl et al. |
| 9,412,727 B2 | 8/2016 | Menard et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,601,356 B2 | 3/2017 | Bower et al. |
| 9,640,715 B2 | 5/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,786,646 B2 | 10/2017 | Cok et al. |
| 9,865,832 B2 | 1/2018 | Bibl et al. |
| 9,929,053 B2 | 3/2018 | Bower et al. |
| 2001/0022564 A1 | 9/2001 | Youngquist et al. |
| 2002/0003132 A1 * | 1/2002 | Scalzotto .......... B23K 26/0884 219/121.78 |
| 2002/0096994 A1 | 7/2002 | Iwafuchi et al. |
| 2003/0141570 A1 | 7/2003 | Chen et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0202595 A1 | 9/2005 | Yonehara et al. |
| 2005/0275615 A1 | 12/2005 | Kahen et al. |
| 2005/0285246 A1 | 12/2005 | Haba et al. |
| 2006/0051900 A1 | 3/2006 | Shizuno |
| 2007/0035340 A1 | 2/2007 | Kimura |
| 2007/0077349 A1 | 4/2007 | Newman et al. |
| 2007/0201056 A1 | 8/2007 | Cok et al. |
| 2008/0211734 A1 | 9/2008 | Huitema et al. |
| 2009/0315054 A1 | 12/2009 | Kim et al. |
| 2010/0078670 A1 | 4/2010 | Kim et al. |
| 2010/0123134 A1 | 5/2010 | Nagata |
| 2010/0148198 A1 | 6/2010 | Sugizaki et al. |
| 2010/0190293 A1 | 7/2010 | Maeda et al. |
| 2010/0214247 A1 | 8/2010 | Tang et al. |
| 2010/0258710 A1 | 10/2010 | Wiese et al. |
| 2010/0289115 A1 | 11/2010 | Akiyama et al. |
| 2010/0306993 A1 | 12/2010 | Mayyas et al. |
| 2011/0032442 A1 | 2/2011 | van Aerle et al. |
| 2011/0211348 A1 | 9/2011 | Kim |
| 2012/0223875 A1 | 9/2012 | Lau et al. |
| 2012/0228669 A1 | 9/2012 | Bower et al. |
| 2012/0314388 A1 | 12/2012 | Bower et al. |
| 2013/0015483 A1 | 1/2013 | Shimokawa et al. |
| 2013/0088416 A1 | 4/2013 | Smith et al. |

(56) References Cited

U.S. PATENT DOCUMENTS

| | | |
|---|---|---|
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2013/0316487 A1 | 11/2013 | de Graff et al. |
| 2014/0104243 A1 | 4/2014 | Sakariya et al. |
| 2014/0159043 A1 | 6/2014 | Sakariya et al. |
| 2014/0175498 A1 | 6/2014 | Lai |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0264763 A1 | 9/2014 | Meitl et al. |
| 2014/0306248 A1 | 10/2014 | Ahn et al. |
| 2015/0028362 A1 | 1/2015 | Chan et al. |
| 2015/0135525 A1 | 5/2015 | Bower |
| 2015/0137153 A1 | 5/2015 | Bibl et al. |
| 2015/0280066 A1 | 10/2015 | Fujimura et al. |
| 2015/0280089 A1 | 10/2015 | Obata et al. |
| 2015/0348926 A1 | 12/2015 | Bower |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0373793 A1 | 12/2015 | Bower et al. |
| 2016/0005721 A1 | 1/2016 | Bower et al. |
| 2016/0011122 A1* | 1/2016 | Pacheco ............. G01N 21/9505 356/369 |
| 2016/0018094 A1 | 1/2016 | Bower et al. |
| 2016/0093600 A1 | 3/2016 | Bower et al. |
| 2017/0025075 A1 | 1/2017 | Cok et al. |
| 2017/0048976 A1 | 2/2017 | Prevatte et al. |
| 2017/0098729 A1* | 4/2017 | Fisher ................. H01L 31/0547 |
| 2017/0213502 A1* | 7/2017 | Henry ................. H01L 25/0753 |
| 2017/0338374 A1 | 11/2017 | Zou et al. |
| 2018/0174932 A1 | 6/2018 | Cok et al. |
| 2018/0315672 A1* | 11/2018 | Cassier ........................... 438/15 |

FOREIGN PATENT DOCUMENTS

| | | |
|---|---|---|
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |
| WO | WO-2014/121635 A1 | 8/2014 |
| WO | WO-2014/149864 A1 | 9/2014 |

OTHER PUBLICATIONS

Cok, R. S. et al., 60.3: AMOLED Displays Using Transfer-Printed Integrated Circuits, Society for Information Display, 10:902-904, (2010).
Cok, R. S. et al., AMOLED displays with transfer-printed integrated circuits, Journal of SID, 19(4):335-341 (2011).
Cok, R. S. et al., Inorganic light-emitting diode displays using micro-transfer printing, Journal of the SID, 25(10):589-609, (2017).
Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties?, American Chemical Society, Langmuir, 12(19):4492-4496, (1996).
Hamer et al., 63.2: AMOLED Displays Using Transfer-Printed Integrated Circuits, SID 09 Digest, 40(2):947-950 (2009).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructured elastomeric surfaces with reversible adhesion and examples of their use in deterministic assembly by transfer printing, PNAS, 107(40):17095-17100 (2010).
Kim, T. et al., Kinetically controlled, adhesiveless transfer printing using microstructured stamps, Applied Physics Letters, 94(11):113502-1-113502-3, (2009).
Lee, S. H. etal, Laser Lift-Offof GaN Thin Film and its Application to the Flexible Light Emitting Diodes, Proc. of SPIE, 8460:846011-1-846011-6 (2012).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Roscher, H., VCSEL Arrays with Redundant Pixel Designs for 10Gbits/s 2-D Space-Parallel MMF Transmission, Annual Report, optoelectronics Department, (2005).
Trindade, A.J. et al., Precision transfer printing of ultra-thin AlInGaN micron-size light-emitting diodes, Crown, pp. 217-218, (2012).
Yaniv et al., A 640 ×480 Pixel Computer Display Using Pin Diodes with Device Redundancy, 1988 International Display Research Conference, IEEE, CH-2678-1/88:152-154 (1988).

* cited by examiner

TESTING TRANSFER-PRINT MICRO-DEVICES ON WAFER

PRIORITY APPLICATION

This application claims the benefit of U.S. Provisional Patent Application No. 62/469,906, filed on Mar. 10, 2017, entitled Testing Transfer-Print Micro-Devices on Wafer, the disclosure of which is hereby incorporated by reference herein in its entirety.

FIELD OF THE INVENTION

The present invention relates to structures and methods for testing transfer printable micro-scale devices on a source wafer.

BACKGROUND OF THE INVENTION

Substrates with electronically active components such as transistors or light-emitting diodes distributed over the extent of the substrate can be used in a variety of electronic systems, for example, flat-panel imaging devices such as flat-panel liquid crystal or organic light emitting diode (OLED) display devices and in flat-panel solar cells. A variety of methods may be used to distribute electronically active circuits over substrates, including forming the electronically active circuits on a substrate, for example thin-film transistor circuits, or forming the components on separate substrates and placing them on a substrate. In the latter case, a variety of assembly technologies for device packaging may be used.

One method for transferring active components from one substrate to another is described in "AMOLED Displays using Transfer-Printed Integrated Circuits" published in the Proceedings of the 2009 Society for Information Display International Symposium Jun. 2-5, 2009, in San Antonio Tex., US, vol. 40, Book 2, ISSN 0009-0966X, paper 63.2 p. 947. In this approach, small integrated circuits are formed over a buried oxide layer on the process side of a crystalline wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate or backplane coated with an adhesive and thereby adhered to the destination substrate. The adhesive is subsequently cured. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In such methods, it is important that pixels in the display are properly functional. The light-emitting semiconductor elements can be tested after they are transferred to the destination substrate and the display rejected if too many faulty light-emitters are found. Alternatively, as described in U.S. Pat. No. 9,142,468, the small integrated circuits on the wafer can be tested before transfer. In this approach, an integrated circuit test structure comprises a substrate and an anchor area comprising one or more electrical elements to conduct an electrical test signal. The anchor area is physically secured to a surface of the substrate. At least one printable electronic component comprises an active layer including one or more active element. The at least one printable electronic component is suspended over the surface of the substrate by electrically conductive breakable tethers that physically secure and electrically connect the at least one printable electronic component to the anchor area to provide the electrical test signal to the one or more active elements. Each of the electrically conductive breakable tethers comprises an insulating layer and a conductive layer thereon that are configured to be preferentially fractured responsive to pressure applied thereto to release the at least one printable electronic component from the substrate. However, electrically conductive breakable tethers limit the materials and number of electrical connections that can be provided to an integrated circuit.

U.S. Pat. No. 9,165,989 discloses a method of assembling integrated circuit elements on a receiving substrate. If one of the integrated circuits is defective, it can be removed from the wafer before assembling. The method comprises providing a wafer having a plurality of chiplets thereon, determining that at least one of the chiplets on the wafer is defective, selectively removing the at least one of the chiplets that is defective from the wafer to define at least one empty chiplet location on the wafer between ones of the chiplets on the wafer prior to transferring the ones of the chiplets onto the receiving substrate, printing the ones of the chiplets from the wafer onto the receiving substrate in parallel, using a stamp that separates the ones of the chiplets from the wafer and adheres the ones of the chiplets thereto, to define the at least one empty chiplet location therebetween on the receiving substrate, and printing at least one additional chiplet onto to the at least one empty chiplet location on the receiving substrate. Thus, as described in U.S. patent application Ser. No. 14/848,477, a wafer of chiplets can comprise a source substrate having an array of regularly-spaced chiplet locations thereon and a plurality of chiplets native to the source substrate. Each chiplet of the plurality of chiplets is disposed on the source substrate in one of the chiplet locations in the array, wherein one or more of the chiplet locations in the array is a removed-chiplet location that is devoid of a chiplet.

There is a need, therefore, for structures and methods that enable the testing and disposition of functional micro-devices on destination substrates (e.g., large-format destination substrates).

SUMMARY OF THE INVENTION

In accordance with an embodiment of the present invention, a method of making and testing transfer-printable micro-devices on a source wafer comprises providing the source wafer comprising a plurality of sacrificial portions spatially separated by anchors, the source wafer comprising one or more test contact pads; providing at least one micro-device disposed entirely over each of the plurality of sacrificial portions, each of the at least one micro-device physically connected to at least one of the anchors; providing one or more electrical test connections from each of the at least one micro-device to a corresponding test contact pad; testing the at least one micro-device disposed over each of the plurality of sacrificial portions through the one or more test connections to determine one or more functional micro-devices and one or more faulty micro-devices; and removing at least a portion of the one or more test connections.

In some embodiments, the sacrificial portions are etched to suspend at least a portion of each micro-device over a corresponding sacrificial portion by the corresponding tether. Etching the sacrificial portions can also remove at least a portion of the one or more test connections and removing at least a portion of the one or more test connections can at least partially define the tethers.

In some embodiments, faulty micro-devices are removed from the source wafer or from a destination substrate provided as a backplane onto which the micro-devices are micro-transfer printed. In some embodiments, only the functional micro-devices are micro-transfer printed to the destination substrate.

Test circuits can be provided on or in the source wafer connected to the test contacts and the test circuits operated to test the micro-devices.

In some embodiments, the micro-devices include light emitters. An optical device can receive light from the light emitters to determine functional micro-devices and faulty micro-devices and an external test controller electrically connected to the test contact pads can test the micro-devices.

In certain embodiments, a transfer-printable micro-device wafer system, comprising: a source wafer comprising a plurality of sacrificial portions spatially separated by anchors and one or more test contact pads; a micro-device disposed entirely over each of the plurality of sacrificial portions, the micro-device physically connected to at least one of the anchors by one or more tethers; and one or more electrical test connections electrically connecting the micro-device to a corresponding test contact pad, wherein the one or more test connections are formed on a part of the source wafer other than the one or more tethers.

In some embodiments, the micro-device includes a controller for controlling the one or more inorganic light-emitting diodes. The micro-device can include a device substrate separate from the source wafer and the controller can include a controller substrate separate from the source wafer and the device substrate.

The micro-device can include one or more inorganic light-emitting diodes and a device substrate separate from the source wafer. The one or more inorganic light-emitting diodes (iLEDs) can include an iLED substrate separate from the source wafer and the device substrate.

In some embodiments, the test connections are electrically connected to the controller and the controller controls the iLEDs to emit light in response to test signals provided through the test connections.

Certain embodiments of the present invention enable, inter alia, a greater variety of test methods and structures for micro-transfer printable micro-devices. Improved tests reduce printing of faulty devices, improving yields and reducing costs.

In one aspect, the present invention is directed to a method of making and testing transfer-printable micro-devices on a source wafer, comprising: providing the source wafer comprising a plurality of sacrificial portions spatially separated by anchors, the source wafer comprising one or more test contact pads; providing at least one micro-device disposed entirely over each of the plurality of sacrificial portions, each of the at least one micro-device physically connected to at least one of the anchors; providing one or more electrical test connections from each of the at least one micro-device to a corresponding test contact pad; testing the at least one micro-device disposed over each of the plurality of sacrificial portions through the one or more test connections to determine one or more functional micro-devices and one or more faulty micro-devices; and removing at least a portion of the one or more test connections.

In certain embodiments, the method comprises etching the plurality of sacrificial portions thereby suspending each micro-device over a corresponding sacrificial portion by at least one corresponding tether. In certain embodiments, etching the plurality of sacrificial portions also removes at least a portion of the one or more test connections.

In certain embodiments, removing at least a portion of the one or more test connections at least partially defines the at least one corresponding tether for each micro-device.

In certain embodiments, the method comprises providing a destination substrate and micro-transfer printing the at least one micro-device disposed entirely over each of the plurality of sacrificial portions to the destination substrate.

In certain embodiments, the method comprises removing the one or more faulty micro-devices from the destination substrate. In certain embodiments, the method comprises removing the one or more faulty micro-devices from the source wafer.

In certain embodiments, the method comprises: providing a destination substrate; and micro-transfer printing only the one or more functional micro-devices to the destination substrate.

In certain embodiments, the method comprises: providing one or more test circuits disposed on or in the source wafer, wherein the test circuits are connected to the one or more test contact pads; and operating the one or more test circuits to test the micro-devices.

In certain embodiments, the micro-devices comprise light emitters. In certain embodiments, the method comprises providing an optical device (e.g., a camera or video camera) for receiving light from the light emitters; and determining the one or more functional micro-devices and the one or more faulty micro-devices using the optical device.

In certain embodiments, the method comprises: providing an external test controller; and electrically connecting the external test controller to the one or more test contact pads to test the at least one micro-device disposed over each of the plurality of sacrificial portions.

In another aspect, the present invention is directed to a transfer-printable micro-device wafer system, comprising: a source wafer comprising a plurality of sacrificial portions spatially separated by anchors and one or more test contact pads; a micro-device disposed entirely over each of the plurality of sacrificial portions, the micro-device physically connected to at least one of the anchors by one or more tethers; and one or more electrical test connections electrically connecting the micro-device to a corresponding test contact pad, wherein the one or more test connections are formed on a part of the source wafer other than the one or more tethers.

In certain embodiments, the micro-device comprises one or more inorganic light-emitting diodes.

In certain embodiments, the micro-device comprises a device substrate separate from the source wafer and each of the one or more inorganic light-emitting diodes (iLEDs) comprises an iLED substrate separate from the source wafer and the device substrate.

In certain embodiments, the micro-device comprises a controller for controlling the one or more inorganic light-emitting diodes. In certain embodiments, the controller comprises a controller substrate separate from the source wafer and the device substrate.

In certain embodiments, the one or more test connections are electrically connected to the controller and the controller controls the one or more iLEDs to emit light in response to test signals provided through the one or more test connections.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

The present invention provides, inter alia, structures and methods for efficiently and effectively testing transfer printable (e.g., micro-transfer printable) micro-devices on a source wafer. In certain embodiments, defective or faulty micro-devices are removed from the source wafer and the remaining micro-devices are transfer printed (e.g., micro-transfer printed) from the source wafer to a desired destination substrate.

Figure 1A:
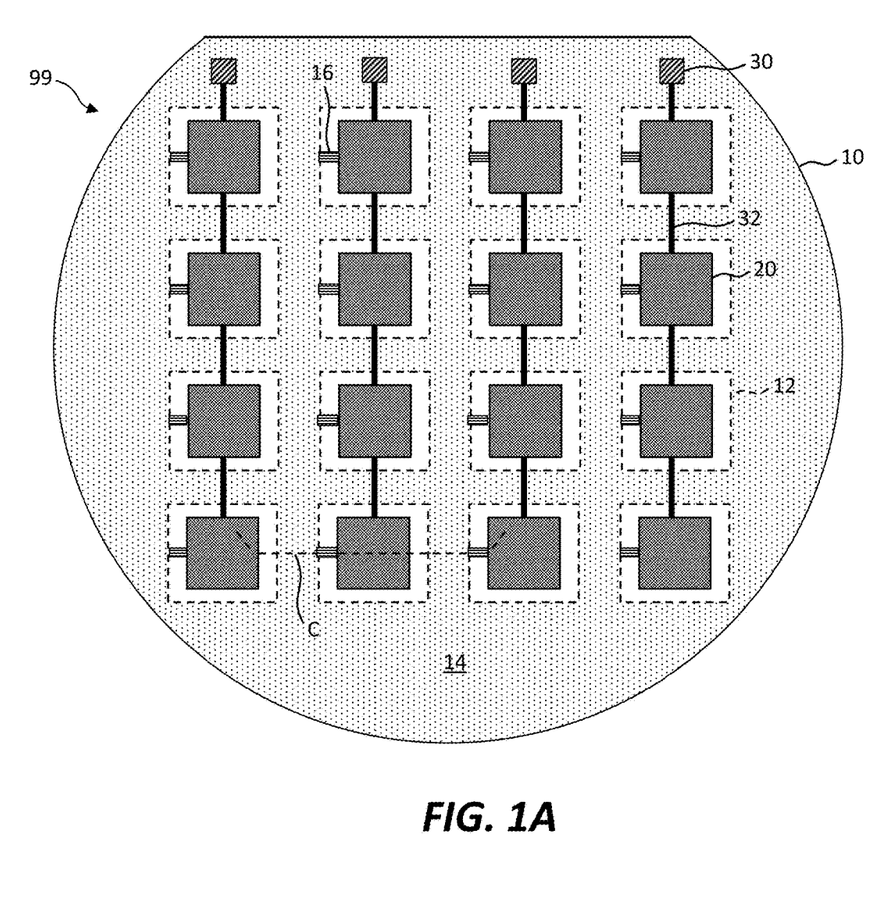
FIG. 1A is a plan view illustrating an exemplary system according to illustrative embodiments of the present invention.
Figure 1B:
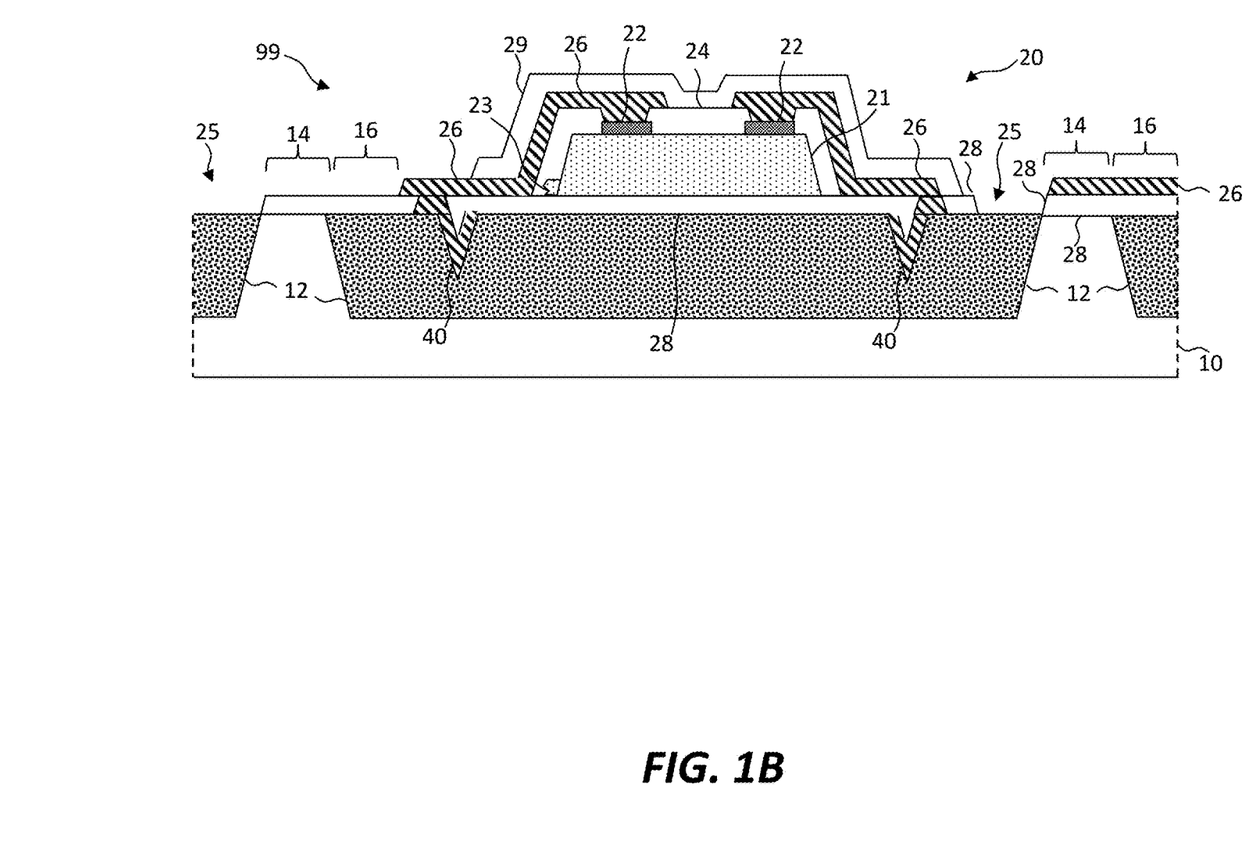
FIG. 1B is a cross section of the FIG. 1A plan view taken across line segment C according to illustrative embodiments of the present invention.
Figure 2A:
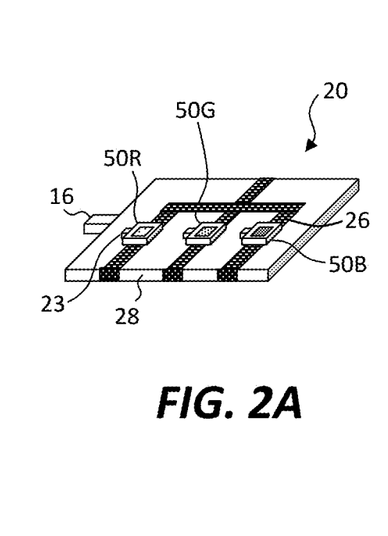
FIGS. 2A and 2B are perspectives of alternative structures of FIGS. 1A and 1B according to illustrative embodiments of the present invention.
Figure 2B:
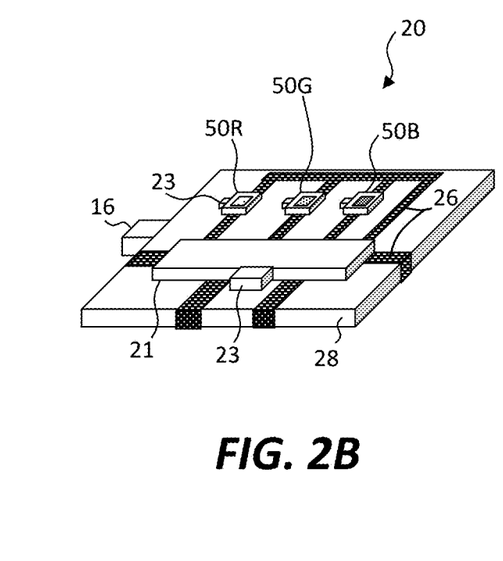
Figure 3:
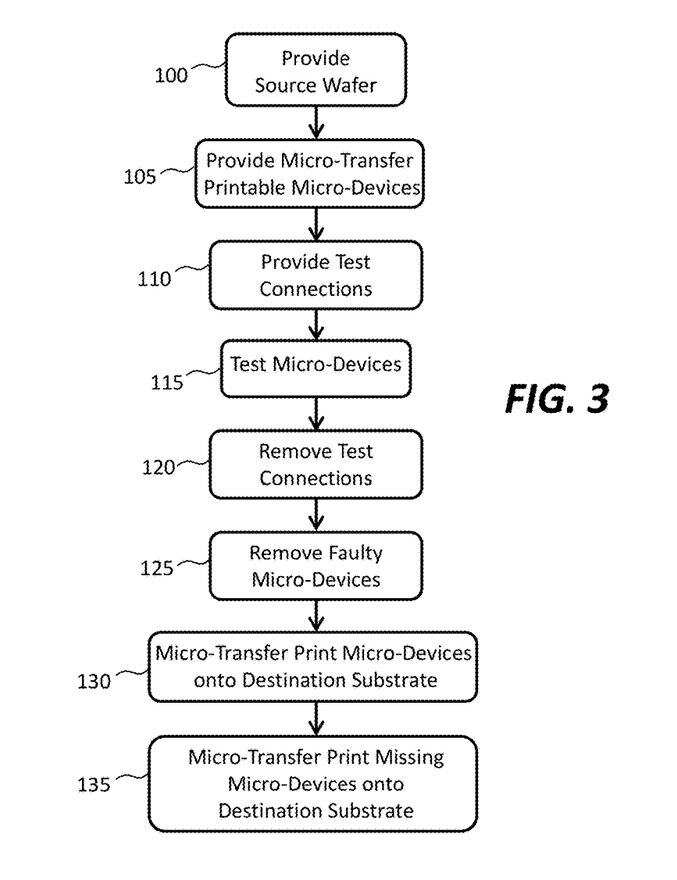
FIG. 3 is a flow diagram illustrating an exemplary method according to illustrative embodiments of the present invention.

Certain embodiments of the present invention are illustrated in the plan view of FIG. 1A, the corresponding cross section of FIG. 1B taken across line segment C of FIG. 1A, the alternative detail perspectives of FIGS. 2A and 2B, and the flow diagram of FIG. 3. As shown specifically in FIGS. 1A and 1B, a transfer-printable micro-device wafer system 99 comprises a source wafer 10 having a plurality of sacrificial portions 12 spatially separated by anchors 14. The source wafer 10 has one or more test contact pads 30 that can be electrically connected to external test devices or test controllers, for example through ribbon cables or electrical connectors or sockets. A micro-device 20 is disposed entirely over each of the sacrificial portions 12. In some embodiments, at least one micro-device 20 is disposed entirely over each of a plurality of sacrificial portions 12. Each micro-device 20 can be physically connected to at least one anchor 14 with one or more tethers 16. For example, in FIG. 1A, each micro-device 20 is attached to one anchor 14 with one tether 16. In some embodiments, micro-devices can be affixed in place with a tether 16 between each micro-device 20 and a source wafer 10 or held in place to an anchor 14 with a sacrificial portion 12. One or more electrical test connections 32 electrically connect each micro-device 20 to a corresponding test contact pad 30. The test connections 32 are formed on a part of the source wafer 10 other than the tether 16.

As shown in FIG. 3, an exemplary method of making and testing transfer-printable micro-devices 20 on a source wafer 10 includes providing in step 100 a source wafer 10 having a plurality of sacrificial portions 12 spatially separated by anchors 14, the source wafer 10 having one or more test contact pads 30 formed, for example, by photolithographic and integrated circuit processes and materials. In step 105, a micro-device 20 is provided entirely over each of the sacrificial portions 12, where each micro-device 20 is physically connected to an anchor 14 with a lateral (as shown) or underlying (not shown) tether 16 or held in place to the anchor 14 with the sacrificial portion 12. The micro-device 20 can be a single integrated circuit or a plurality of integrated circuits, electronic circuit devices, or other electronic structures or structures having electronic attributes or capabilities. One or more of the micro-device 20 can be made in place, for example using integrated circuit processes and materials, or disposed on or over the sacrificial portions 12, for example using micro-transfer printing methods, and electrical connections or electrodes 26 provided to enable electrical connections to the one or more micro-devices 20. In step 110, one or more electrical test connections 32 are provided electrically connecting each micro-device 20 to a corresponding test contact pad 30.

In some embodiments, test contact pads 30, electrical test connections 32, and any electrodes 26 are made in a common step with common materials, for example metal wires such as aluminum, silver, tungsten, titanium, tin, or gold, for example, using photolithographic methods or printing-based methods such as inkjet printing. Test contact pads 30 can be designated portions of electrical test connections 32 or electrical test connections 32 can include test contact pads 30 or both. Test contact pads 30 and electrical test connections 32 can be made of common materials in a common step; they are not necessarily distinguished and can be part of a common electrically conductive structure. The resolution of an electrical conductor or connection is the size of the smallest element in a dimension over an area that can be reliably made or the minimum spacing between components that can be reliably achieved without electrical shorts. In various embodiments, electrodes 26 have a resolution of less than or equal to 10 microns, less than or equal to 5 microns, less than or equal to two microns or less than or equal to one micron.

Figure 4:
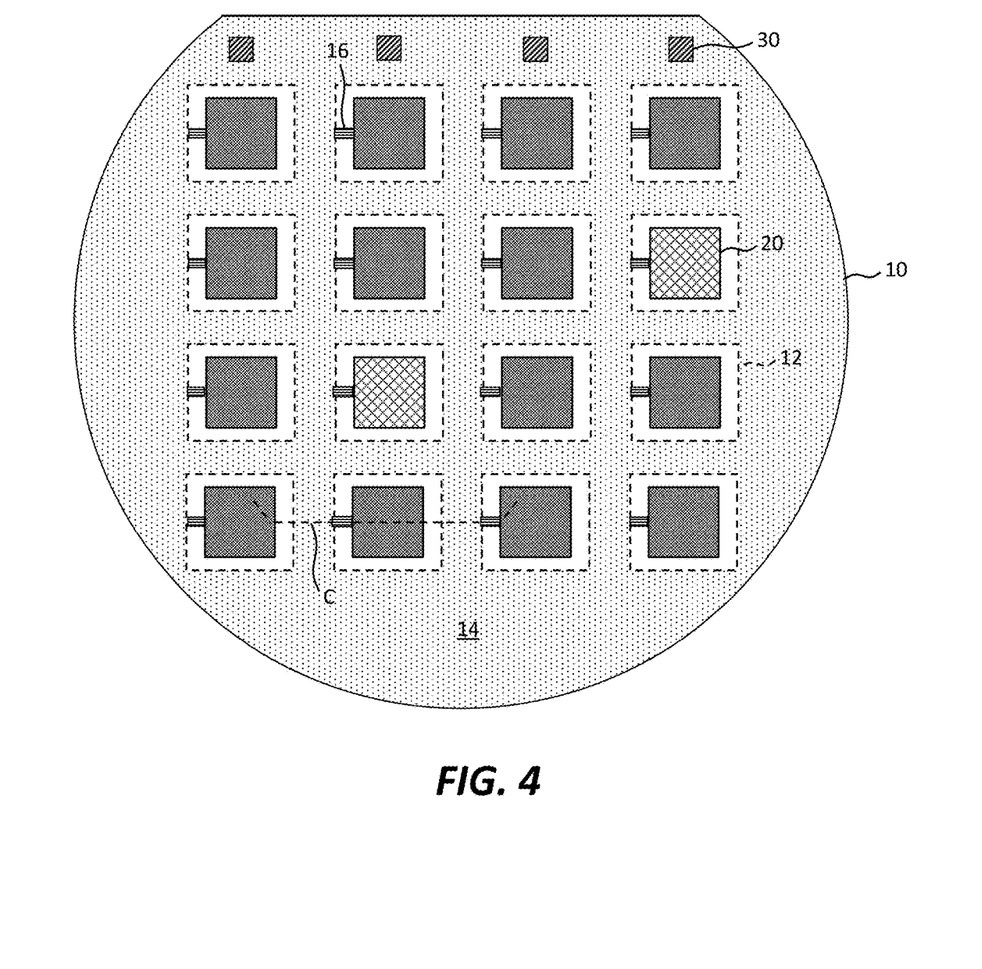
FIG. 4 is a plan view illustrating an exemplary system after test and removal of the test connections, according to illustrative embodiments of the present invention.
Figure 5:
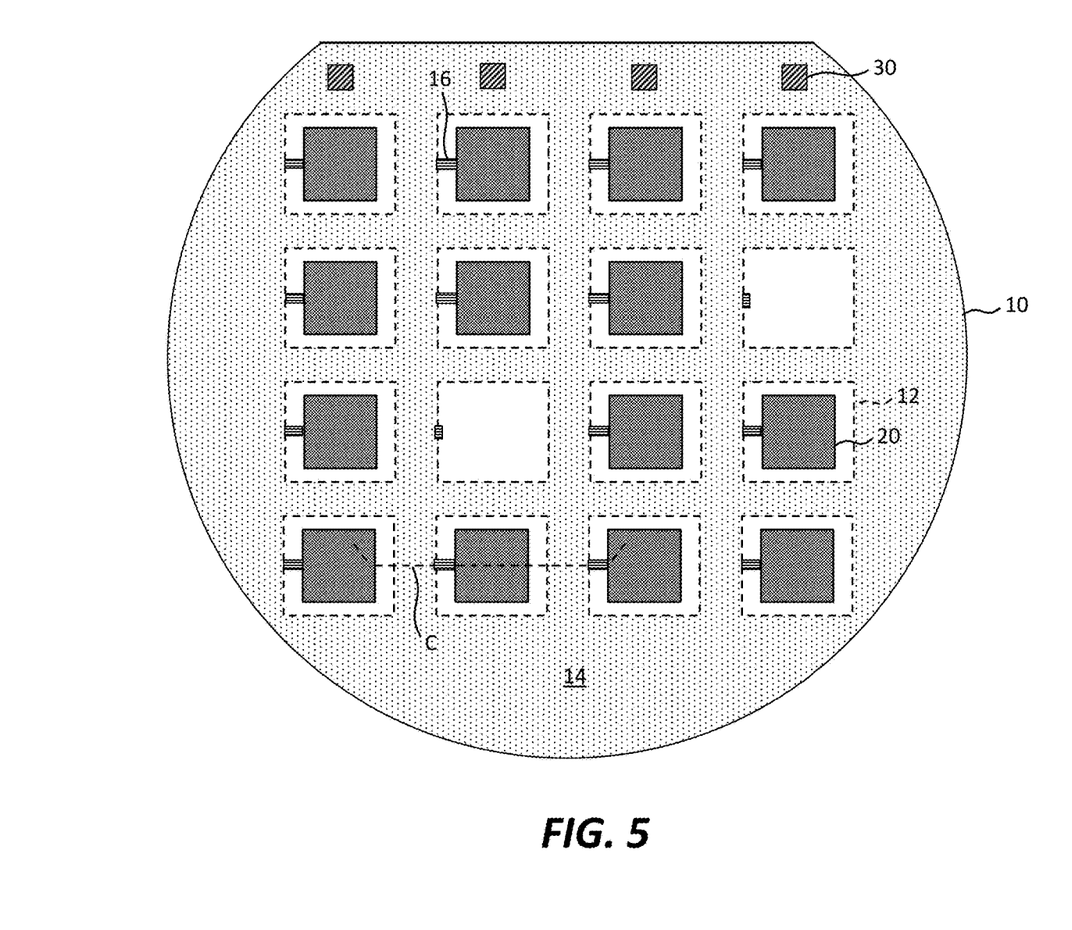
FIG. 5 is a plan view illustrating an exemplary system after faulty micro-device removal, according to illustrative embodiments of the present invention.

The micro-devices 20 are tested in step 115 through the test connections 32 to determine functional micro-devices 20 and faulty micro-devices 20. At least a portion of the one or more test connections 32 are removed in step 120, for example the portion of the one or more test connections 32 that are attached to the micro-devices 20 over the sacrificial portions 12 (e.g., as shown in FIG. 4). In some embodiments, only portions of a test connection 32 over sacrificial portions 12 are removed, while the portion(s) of the test connection 32 that are not over any sacrificial portion 12 remain. For example, referring to FIG. 1A, the portions of test connections 32 over sacrificial portions 12 can be removed while leaving behind the portions not over sacrificial portions 12. In step 125, the faulty micro-devices 20 (e.g., as illustrated in FIG. 4 with cross hatching) are removed from the source wafer 10 (e.g., as shown in FIG. 5). Removing the faulty micro-devices 20 can include etching the sacrificial portions 12 to at least partially suspend each micro-device 20 over a corresponding sacrificial portion 12 by the corresponding tether 16 followed by micro-transfer printing the faulty micro-devices 20 to an unused or disposal substrate. Etching the sacrificial portions 12 can also remove at least a portion of the one or more test connections 32. Furthermore, removing at least a portion of the one or more test connections 32 can at least partially define the tethers 16.

In step 130, the remaining functional micro-devices 20 are micro-transfer printed to a desired destination substrate. The destination substrate can be provided with substrate contact pads to make electrical connections to the micro-devices 20 or the destination substrate electrical connections can be made after the destination substrate is provided. In step 135, other functional micro-devices 20 are micro-transfer printed from a source wafer 10 to the desired destination substrate in the locations where no functional micro-devices 20 were micro-transfer printed because the faulty micro-devices 20 were removed from the source wafer 10. The system of micro-devices 20 on the destination substrate can then be put into service and operated.

In some embodiments, faulty micro-devices 20 are not removed from a source wafer 10 (e.g., as in step 125) but are removed from the destination substrate after the micro-devices 20 have been transfer printed (e.g., micro-transfer printed). In some such embodiments, all of a plurality of micro-devices 20, including both one or more functional and one or more faulty micro-devices 20 are transfer printed (e.g., micro-transfer printed) to a destination substrate. The one or more faulty micro-devices 20 are then removed or electrically isolated from the destination substrate and replaced with corresponding functional micro-devices 20 or additional functional micro-devices 20 are added in the faulty micro-device 20 locations.

By providing test connections 32 on a part of a source wafer 10 other than a tether 16, a greater variety of materials and a greater number of test connections 32 can be formed and used to facilitate testing micro-devices 20. Tethers 16 are typically quite small, for example a few microns in width and depth, and there is, therefore, limited space for electrically conductive test connections 32 on a typical tether 16. Moreover, materials that make up tethers 16 are carefully chosen and structured to fracture in a desired manner under carefully controlled pressure and conditions found in micro-transfer printing with a stamp. In certain embodiments, forming effective test connections 32 can interfere with the tether 16 fracturing process, inhibiting successful transfer printing (e.g., successful micro-transfer printing). In some embodiments, in which tethers 16 are not present, test connections 32 are the only way to electrically test micro-devices 20 prior to transfer printing. Thus, certain embodiments of the present invention can enable effective testing and transfer printing of micro-devices 20 on and from a source wafer 10.

A source wafer 10 can be any wafer suitable for lithographic or integrated circuit processing, for example, glass, plastic, quartz, metal, ceramic, or a semiconductor substrate such as silicon (e.g., silicon {111} or silicon {100}, where the indices refer, as is convention, to the orientation of silicon relative to the processing surface of the substrate). A source wafer 10 can be circular with a flat edge (e.g., as shown in FIG. 1A) or circular or rectangular or any shape (e.g., polygonal shape) that is readily processed in a fabrication facility.

Sacrificial portions 12 can be designated portions of a source wafer 10, for example when the source wafer 10 comprises anisotropically etchable semiconductor materials that enables etching in one direction in preference to another. In some embodiments, sacrificial portions 12 include a material that is differentially etchable from a source wafer 10 material or a layer of a micro-device 20, for example a layer of the micro-device 20 that is adjacent to the source wafer 10. Sacrificial portions 12 can be rectangular, as shown, and can include patterned oxides or nitrides such as silicon dioxide or silicon nitride. Thus, in an exemplary method according to certain embodiments of the present invention, a patterned sacrificial portion 12 is a patterned layer of material different from a source wafer 10 material that can be etched to form at least a gap that extends at least partially between at least a portion of a micro-device 20 and a source wafer 10. In an exemplary method according to certain embodiments of the present invention, a patterned sacrificial portion 12 is a defined portion of a source wafer 10 that can be anisotropically etched to form a gap that extends at least partially between at least a portion of a micro-device 20 and a source wafer 10. In some embodiments, sacrificial portions 12 define gaps or are filled with an etchable material. An etched sacrificial portion results in one or more tethers 16 that physically connects a micro-device 20 to at least one anchor 14. In certain embodiments, a stamp post of a micro-transfer stamp can contact a micro-device 20, fracture one or more tethers 16 to separate the micro-device 20 from its source wafer 10, and adhere the micro-device 20 to the stamp post and thereby enable the micro-device 20 to be micro-transferred to a destination substrate.

An anchor or anchors 14 can be one or more areas of a source wafer 10 surface that are not covered with sacrificial portions 12 or micro-devices 20. A device substrate 28 of each micro-device 30 can be surrounded in a lateral, horizontal direction parallel to the surface of a source wafer 10 by one or more sacrificial portions 12 and sacrificial portions 12 can be surrounded by anchors 14 in the lateral, horizontal direction parallel to the surface of a source wafer 10. Test contact pads 30 and test connections 32 can be patterned metal structures such as rectangular areas, lines, traces, or wires, and can be formed on a source wafer 10, for example using photolithographic processes and materials or by inkjet printing conductive inks.

As shown in the cross section of FIG. 1B, a micro-device 20 can be disposed on a source wafer 10 and can include a device substrate 28, for example a patterned layer of dielectric material such as silicon dioxide or silicon nitride. A device substrate 28 can include an adhesive layer (or have an adhesive layer disposed thereon), for example a curable or cured adhesive such as SU8. In certain embodiments, a micro-device 20 is located entirely over a corresponding sacrificial portion 12 and can include one or more integrated circuits 21 (ICs) that can each have a broken (e.g., fractured) or separated IC tether 23 and that each can be transfer printed (e.g., micro-transfer printed) onto a device substrate 28 from respective IC source wafers. Integrated circuits 21 can be semiconductor (such as silicon) devices such as CMOS logic circuits or compound semiconductor devices such as inorganic light-emitting diodes (iLEDs) 50 (for example, as shown in FIGS. 2A, 2B), any one or all of which can comprise an IC tether 23. In some embodiments, referring to the FIG. 2A perspective, a micro-device 20 includes one or more red iLEDs 50R that emit red light, one or more green iLEDs 50G that emit green light, and one or more blue iLEDs 50B that emit blue light, collectively iLEDs, that can form a passive-matrix display pixel module. In certain embodiments, iLEDs can be transfer printed (e.g., micro-transfer printed) to a device substrate 28 and can, in consequence, have a broken (e.g., fractured) or separated IC tether 23. In some embodiments, referring to the perspective of FIG. 2B, a micro-device 20 further includes an IC 21 pixel controller that can control the light output by the red, green, and blue iLEDs 50R, 50G, 50B to form an active-matrix display pixel module (e.g., an RGB pixel module). In some embodiments, an IC 21 pixel controller can also be transfer printed (e.g., micro-transfer printed) to a device substrate 28 and can, in consequence, comprise a broken (e.g., fractured) or separated IC tether 23.

Integrated circuits 21 can be bare die adhered to a device substrate 28. Protective dielectric structures 24 can insulate integrated circuits 21 and expose device contacts 22 that provide electrical connections to electrodes 26. Dielectric structures 24 can be patterned oxide or nitride materials such as silicon dioxide or silicon nitride. Device contacts 22 can be designated portions of an IC 21, for example a designated portion of a doped or undoped semiconductor layer or semiconductor structure. In some embodiments, device contacts 22 are metallized portions of an IC 21. Electrodes 26 can be patterned metal traces, such as aluminum, gold, silver, tungsten, tantalum, titanium or other metals or metal alloys. These elements can be deposited (e.g., by evaporation or coating) and patterned (e.g., with photo-sensitive material and exposure masks) using photolithographic methods, materials, and tools.

A micro-device 20 can also include a protective encapsulation layer 29, if desired, that can extend over or be part of a tether 16 (not shown), or not (e.g., as shown in FIG. 1B). An encapsulation layer 29 can be made of a dielectric material such as silicon dioxide or nitride. In certain embodiments, a conductive material (e.g., a contact pad or electrode 26) extends beyond an edge of an encapsulation layer 29 (as shown in FIG. 1B), or no encapsulation layer 29 is present (not shown), such that an electrical connection can be made between a micro-device 20 and a test connection 32. In certain embodiments, a via through an encapsulation layer 29 exists such that a test connection 32 can be electrically connected to a micro-device 20. A tether 16 can be in a common layer with or made in a common step with common materials as a device substrate 28 but the device substrate 28 refers only to that portion of the layer over or on the sacrificial portion 12 and not attached to an anchor 14. In some embodiments, a tether 16 includes portions of layers made in common steps with both a device substrate 28 and an encapsulation layer 29. Protective dielectric structures 24, device contacts 22, electrodes 26, and an encapsulation layer 29 can all be made using photolithographic methods and materials. In some embodiments, a device substrate 28, an optional encapsulation layer 29, a tether 16, and patterned dielectric structures 24 can all be or comprise the same material.

Thus, in some embodiments of the present invention, micro-devices 20 include a device substrate 28, an integrated circuit pixel controller 21 with a controller substrate, and one or more iLEDs (e.g., one or a combination of red iLED 50R, green iLED 50G, and blue iLED 50B), all of which are distinct, independent, and separate from each other and from a source wafer 10 and destination substrate and have a substrate that is separate, independent, and distinct. A substrate that is separate, independent, and distinct from another substrate can be made separately at a different time or at a different location using different materials or methods than the other substrate. Each separate, independent, and distinct substrate can exist and be processed, transported, or manipulated independently of any other separate, independent, and distinct substrate. In some embodiments, each iLED (e.g., one or a combination of a red iLED 50R, a green iLED 50G, and a blue iLED 50B), pixel controller 21, and device substrate 28 can be independently micro-transfer printed from respective source wafers (e.g., iLED or pixel controller source wafers).

In some embodiments of the present invention, a micro-device 20 includes electrically conductive connection posts 40 that are electrically connected to electrodes 26 and thence to device contacts 22 to enable power, ground, and control signals to operate one or more ICs 21 disposed on or in the micro-device 20. Connection posts 40 enable electrical connections to be made to a micro-device 20 by transfer printing (e.g., micro-transfer printing). Connection posts 40 can be made by pattern-wise etching forms into sacrificial portions 12 before a device substrate 28 or IC(s) 21 are disposed or formed over sacrificial portions 12. The forms are then pattern-wise coated with an electrical conductor such as metal. The device substrate 28 is deposited and patterned to form vias and openings 25. Connection posts 40 are discussed in more detail, in U.S. Pat. No. 8,889,485, entitled Methods for Surface Attachment of Flipped Active Components by Christopher Bower, and in U.S. patent application Ser. No. 14/822,864, filed Aug. 10, 2015, entitled Chiplets with Connection Posts by Prevatte et al., the disclosures of each of which are incorporated herein by reference in their entirety.

ICs 21 can be disposed on a source wafer 10, for example by micro-transfer printing, or formed in situ using integrated circuit processes and materials, or both, and any device contacts 22 formed. In an exemplary method according to certain embodiments, a patterned epitaxial growth layer is provided upon sacrificial portions 12 and structures are formed on the epitaxial growth layer. Electrodes 26 are then deposited and patterned, as is an encapsulation layer 29. IC(s) 21 can be protected by patterning dielectric structures 24 and electrically connected to connection posts 40 by patterning electrical conductors (e.g., electrodes 26) that fill vias and form wires over the dielectric structures 24 connected to device contacts 22. Sacrificial portions 12 can be etched through an opening 25 between micro-devices 20 (e.g., adjacent to a device substrate 28) and one or more anchors 14.

Micro-devices 20 can be tested by providing a test circuit on a source wafer 10 or electrically connecting an external test controller (not shown) to test contact pads 30, for example through a ribbon cable. A test controller provides electrical test signals that propagate through test contact pads 30, test connections 32, connection posts 40 (if present), electrodes 26, and device contacts 22 to electrically stimulate a micro-device 20. An electrical response from the micro-device 20 can be returned to the controller through the electrical connections for analysis and determination of a functional or faulty micro-device 20. In some embodiments in which a micro-device 20 is a light emitter, for example an iLED, an optical device such as a camera can be located to receive light emitted from the micro-device 20, for example take a picture (e.g., still or video picture) of the operating device. In some such embodiments, it can be useful to control all of a plurality of micro-devices 20 to emit light at the same time so that a single image captures the output of the plurality of micro-devices 20 on a source wafer 10 at a single moment. The image can then be downloaded from the camera to the test controller and analyzed to determine functional and faulty micro-devices 20. Faulty micro-devices 20 can, for example, emit too little, too much, or the wrong color of light, or require too much electrical current.

Once faulty micro-devices 20 have been determined, they can be removed from a source wafer 10, for example using a micro-transfer printing stamp with a single post that sequentially contacts and prints the faulty micro-devices 20 from the source wafer 10 to a waste substrate, such as a piece of disposable adhesive tape. Remaining micro-devices 20 can then be micro-transfer printed with a stamp having a post for each location of micro-devices 20, whether the location of a functional micro-device 20 or the location of a removed faulty micro-device 20. The stamp posts located at the positions of removed faulty micro-devices 20 will perform no function. In certain embodiments, after the remaining functional micro-devices 20 are micro-transfer printed to a desired destination substrate, the destination substrate will have locations where a micro-device 20 is desired but no micro-device 20 is present. A single post micro-transfer stamp can then print one functional micro-device 20 at a time from the same or another source wafer 10 to the desired locations on the destination substrate to complete the printing process. In some embodiments of the present invention, it can be easier, faster, or cheaper to remove faulty micro-devices 20 from a source wafer 10 than a destination wafer.

Micro-devices 20 can be active components, for example including one or more active elements such as integrated circuits, electronic transistors, or diodes or light-emitting diodes and photodiodes that produce an electrical current in response to ambient light as well as passive components such as resistors, capacitors, or conductors. Micro-devices 20 can be semiconductor devices having one or more semiconductor layers, such as an integrated circuit 21. Micro-devices 20 can be or include unpackaged die. In some embodiments, micro-devices 20 are compound elements having a plurality of active and/or passive elements, such as multiple semiconductor devices with separate substrates, each with one or more active elements or one or more passive elements, or both.

Micro-devices 20 made by methods in accordance with certain embodiments of the present invention can include or be a variety of chiplets (micro-ICs 21) having semiconductor structures, including a diode, a light-emitting diode (LED) (such as a micro-LED that can be an inorganic LED), a transistor, or a laser. Micro-devices 20 can include inorganic materials such as silicon or gallium arsenide, or inorganic materials having various structures, including crystalline, microcrystalline, polycrystalline, or amorphous structures. Micro-devices 20 can also include insulating layers and structures such as silicon dioxide, nitride, and passivation layers and conductive layers or structures such as wires made of aluminum, titanium, silver, or gold that form an electronic circuit.

Micro-devices 20 can include or be one or more small integrated circuits 21 (chiplets) that can be unpackaged dies transferred from respective IC source wafers, such as a semiconductor or compound semiconductor source wafer, and, in some embodiments, can be micro transfer printed. Chiplets can have at least one of a width from 2 to no more than 5 µm, 5 to no more than 10 µm, 10 to no more than 20 µm, or 20 to no more than 50 µm, a length from 2 to no more than 5 µm, 5 to no more than 10 µm, 10 to no more than 20 µm, or 20 to no more than 50 µm, and a height from 2 to no more than 5 µm, 5 to no more than 10 µm, 10 to no more than 20 µm, or 20 to no more than 50 µm. Chiplets can have a doped or undoped semiconductor substrate thickness of 2 to no more than 5 µm, 5 to no more than 10 µm, 10 to no more than 20 µm, or 20 to no more than 50 µm. Chiplets can be micro-light-emitting diodes with a length greater than width, for example having a length to width aspect ratio greater than or equal to 2, 4, 8, 10, 20, or 50 and device contacts 22 that are adjacent to the ends of the printable semiconductor chiplets along the length of the printable semiconductor chiplets. This structure enables low-precision manufacturing processes to electrically connect wires to the device contacts 22 without creating registration problems and possible unwanted electrical shorts or opens.

Methods of forming micro-transfer printable structures are described, for example, in the paper "AMOLED Displays using Transfer-Printed Integrated Circuits" and U.S. Pat. No. 8,889,485. Lithographic processes for forming chiplets, for example transistors, wires, and capacitors, can be found in the integrated circuit art. U.S. patent application Ser. No. 14/743,981, filed Jun. 18, 2015, entitled Micro Assembled LED Displays and Lighting Elements, incorporated by reference herein, describes micro-transfer printing structures and processes useful in structures and methods according to certain embodiments of the present invention. For a discussion of micro-transfer printing techniques see also U.S. Pat. Nos. 8,722,458, 7,622,367 and 8,506,867, the disclosure of each of which is hereby incorporated by reference in its entirety. Micro-transfer printing using compound micro assembly structures and methods can also be used in structures and methods according to certain embodiments of the present invention, for example, as described in U.S. patent application Ser. No. 14/822,868, filed Aug. 10, 2015, entitled Compound Micro-Assembly Strategies and Devices, which is hereby incorporated by reference in its entirety. A micro-device 20 can be a compound microsystem.

According to various embodiments of the present invention, a native source wafer 10 can be provided with micro-devices 20, sacrificial portions 12, tethers 16, anchors 14, and source connection posts 40 already formed, or they can be constructed as part of a method in accordance with certain embodiments of the present invention. In certain embodiments, device contacts 22 are planar electrical connections formed on a process side of micro-devices 20 and source wafer 10. Such device contacts 22 are typically formed from metals such as aluminum or polysilicon using masking and deposition processes.

Connection posts 40 are electrical connections that extend generally perpendicular to the surface of a micro-device 20. Such connection posts 40 can be formed from metals such as aluminum, titanium, tungsten, copper, silver, gold, or other conductive metals. Connection posts 40 can be formed by repeated masking and deposition processes that build up three-dimensional structures or by using a form. In some embodiments, connection posts 40 are made of one or more high elastic modulus metals, such as tungsten. As used herein, a high elastic modulus is an elastic modulus sufficient to maintain the function and structure of the connection post 40 when pressed into an electrical contact pad. Connection posts 40 can have a variety of aspect ratios and typically have a peak area smaller than a base area. Connection posts 40 can have a sharp point for embedding in or piercing electrical contact pads. Structures with protruding connection posts 40 are generally discussed in U.S. Pat. No. 8,889,485, referenced above, whose contents are incorporated by reference herein in their entirety.

In an exemplary micro-transfer printing process, a stamp includes a plurality of stamp posts (also referred to as pillars) that are pressed against corresponding released micro-devices 20 to adhere the components to the stamp posts to transfer the pressed components from the source wafer 10 to the stamp posts. A released micro-device 20 is one whose underlying sacrificial portion 12 has been etched to form a gap between the micro-device 20 and its source wafer 10, wherein the etching has defined one or more tethers 16 physically connecting the released micro-device 20 to one or more anchors 14 of the source wafer 10. By pressing the stamp against the micro-devices 20, the tethers 16 are broken or separated and the micro-devices 20 are adhered to the stamp posts, for example by van der Waal's forces. The stamp is removed from the source wafer 10, leaving the micro-devices 20 adhered to the stamp posts. An adhesive layer can be provided on a destination substrate. The stamp is then placed adjacent to the destination substrate. The micro-devices 20 on the stamp posts of the transfer stamp are brought into alignment with electrical conductors on a destination substrate and pressed onto or into them by micro-transfer printing with sufficient mechanical pressure against the electrical conductors to drive the connection posts 40 into or through a surface of the electrical conductors to form a robust electrical contact between the connection posts 40 of the micro-devices 20 and the destination substrate electrical conductors. A sufficient mechanical pressure can be an amount of force needed to cause the substrate electrical conductors or connection post 40 to plastically deform as the connection post 40 is pressed into the substrate electrical conductors. Thus, in this exemplary embodiment, the connection posts 40 on the components may have sharp points and/or a high elastic modulus, for example, by incorporating tungsten. A connection post 40 can have a sharp point, for example, if the top of the post has an area less than 10 microns square, less than 5 microns square, or less than one micron square. The substrate electrical conductors can also provide adhesion to help adhere the components to the substrate. In some embodiments, components (e.g., micro-devices 20) do not have connection posts 40 but are adhered to a substrate with an adhesive and photolithographic methods are used to form electrical connections.

The adhesion between the micro-devices 20 and the receiving side of the substrate should be greater than the adhesion between the micro-devices 20 and the stamp posts of the transfer stamp. Thus, when the transfer stamp is removed from the receiving side of the substrate, the micro-devices 20 adhere more strongly to the destination substrate than to the transfer stamp, thereby transferring the micro-devices 20 from the transfer stamp to the receiving side of the destination substrate.

The transfer stamp is then removed leaving the micro-devices 20 adhered to the destination substrate. An optional heat treatment can solder or weld connection posts 40 (if present) of micro-devices 20 to destination substrate electrical contacts. Thus, in a method in accordance with certain embodiments of the present invention, destination substrate electrical contacts (or connection posts 40) are heated, causing a substrate electrical contact metal to reflow and improve adhesion between components (e.g., micro-devices 20) and the substrate and improve the electrical connection to the connection posts 40.

Connection posts 40 can be made by pattern-wise etching a forming layer. For example, a silicon 100 wafer can be etched by a combination of dielectric hard masks, photolithography, mask etching, and anisotropic silicon wet etching with, for example KOH or TMAH, or dry etching. A layer of conductive material is deposited, for example with evaporation, e-beam deposition, sputtering, or CVD, and patterned by etching through a patterned photo-resist mask, to form connection posts 40 at least in the form. Soft metals can be used, such as gold, silver, tin, solders, or hard materials such as Ti, W, Mo, Ta, Al, or Cu.

A destination substrate for receiving transfer-printed printable components can include a surface on or in which a plurality of non-planar contact pads or electrical conductors are formed and exposed on the surface so that electrical connections can be made to the electrical conductors, such as electrical contact pads. The electrical contact pads can be multi-layer contact pads and can include a layer of solder. In some embodiments, electrical contact pads can be coated with a non-conductive layer or formed on a compliant non-conductive layer, to facilitate electrical connection and adhesion. The non-conductive layer can be a polymer or an adhesive or the compliant non-conductive layer can be a polymer.

According to some embodiments of the present invention, a source wafer 10 can be provided with electronic elements, electrodes 26, and connection posts 40 already formed on the source wafer 10. In some embodiments, an unprocessed source wafer 10 can be provided and electronic elements (e.g., micro-devices 20 or portions thereof), electrodes 26, and connection posts 40 formed on the source wafer 10. An unprocessed source wafer 10 is a substrate that does not yet include the electronic elements, electrodes 26, and connection posts 40. The unprocessed source wafer 10 can have other processing steps completed, for example, cleaning, deposition of material layers, or heat or chemical treatments. In certain embodiments, integrated circuits 21 are formed, for example using photo-lithographic processes including forming masks over a source wafer 10, etching materials, removing masks, and depositing materials. Using such processes, integrated circuits 21 can be formed on or in a source wafer 10.

In some embodiments, micro-devices 20 include small integrated circuits 21 (chiplets) formed in a semiconductor wafer, for example silicon or compound semiconductors such as gallium arsenide, which can have a crystalline structure. Processing technologies for these materials typically employ high heat and reactive chemicals. However, by employing transfer technologies that do not stress the chiplets or substrate materials, more benign environmental conditions can be used compared to thin-film manufacturing processes. Thus, certain embodiments of the present invention have an advantage in that flexible substrates, such as polymeric substrates, that are intolerant of extreme processing conditions (e.g. heat, chemical, or mechanical processes) can be employed for a destination substrates. Furthermore, it has been demonstrated that crystalline silicon substrates have strong mechanical properties and, in small sizes, can be relatively flexible and tolerant of mechanical stress. This is particularly true for substrates having 5-micron, 10-micron, 20-micron, 50-micron, or even 100-micron thicknesses.

Micro-devices 20 or chiplets disposed thereon or therein can be constructed using foundry fabrication processes. Layers of materials can be used, including materials such as metals, oxides, nitrides and other materials. Each chiplet can be a complete semiconductor integrated circuit 21 and can include, for example, transistors. Micro-devices 20 or chiplets can have different sizes, for example, 1000 square microns or 10,000 square microns, 100,000 square microns, or 1 square mm, or larger, and can have variable aspect ratios, for example 1:1, 2:1, 5:1, or 10:1. Micro-devices 20 or chiplets can be rectangular or can have other shapes.

Certain embodiments of the present invention provide advantages over other methods described in the prior art. By employing connection posts 40 on micro-devices 20 and a printing method that provides connection posts 40 adjacent to electrical contact pads on a destination substrate, a low-cost method for printing chiplets in large quantities over a destination substrate is enabled. Furthermore, in certain embodiments, additional process steps for electrically connecting micro-devices 20 to a destination substrate are obviated and faulty micro-devices may have already been removed prior to electrical connection.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations, a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

C cross section line segment
10 source wafer
12 sacrificial portion
14 anchor
16 tether
20 micro-device
21 integrated circuit (IC)/pixel controller
22 device contacts
23 IC tether/pixel controller tether
24 dielectric structure
25 opening
26 electrode
28 device substrate
29 encapsulation layer
30 test contact pads
32 test connections
40 connection post
50R red iLED
50G green iLED
50B blue iLED
99 transfer-printable micro-device wafer system
100 provide source wafer step
105 provide micro-transfer printable micro-devices step
110 provide test connections step
115 test micro-devices step
120 remove test connections step
125 remove faulty micro-devices step
130 micro-transfer print micro-devices onto destination substrate step
135 micro-transfer print missing micro-devices onto destination substrate step

The invention claimed is:

1. A method of making and testing transfer-printable micro-devices on a source wafer, comprising:
providing the source wafer comprising a plurality of sacrificial portions spatially separated by anchors, the source wafer comprising one or more test contact pads;
providing at least one micro-device disposed entirely over each of the plurality of sacrificial portions, each of the at least one micro-device physically connected to at least one of the anchors;
providing one or more electrical test connections from each of the at least one micro-device to a corresponding test contact pad;
testing the at least one micro-device disposed over each of the plurality of sacrificial portions through the one or more test connections to determine one or more functional micro-devices and one or more faulty micro-devices; and
removing at least a portion of the one or more test connections.

2. The method of claim 1, comprising etching the plurality of sacrificial portions thereby suspending each micro-device over a corresponding sacrificial portion by at least one corresponding tether.

3. The method of claim 2, wherein etching the plurality of sacrificial portions also removes at least a portion of the one or more test connections.

4. The method of claim 2, wherein removing at least a portion of the one or more test connections at least partially defines the at least one corresponding tether for each micro-device.

5. The method of claim 2, comprising providing a destination substrate and micro-transfer printing the at least one micro-device disposed entirely over each of the plurality of sacrificial portions to the destination substrate.

6. The method of claim 5, comprising removing the one or more faulty micro-devices from the destination substrate.

7. The method of claim 1, comprising removing the one or more faulty micro-devices from the source wafer.

8. The method of claim 7, comprising:
providing a destination substrate; and
micro-transfer printing only the one or more functional micro-devices to the destination substrate.

9. The method of claim 1, comprising:
providing one or more test circuits disposed on or in the source wafer, wherein the test circuits are connected to the one or more test contact pads; and
operating the one or more test circuits to test the micro-devices.

10. The method of claim 1, wherein the micro-devices comprise light emitters.

11. The method of claim 10, comprising:
providing an optical device for receiving light from the light emitters; and determining the one or more functional micro-devices and the one or more faulty micro-devices using the optical device.

12. The method of claim 1, comprising:
providing an external test controller; and
electrically connecting the external test controller to the one or more test contact pads to test the at least one micro-device disposed over each of the plurality of sacrificial portions.

13. A transfer-printable micro-device wafer system, comprising:
- a source wafer comprising a plurality of sacrificial portions spatially separated by anchors, the source wafer further comprising one or more test contact pads;
- a micro-device disposed entirely over each of the plurality of sacrificial portions, the micro-device physically connected to at least one of the anchors by one or more tethers; and
- one or more electrical test connections electrically connecting the micro-device to a corresponding test contact pad,
- wherein the one or more test connections are formed on a part of the source wafer other than the one or more tethers.

14. The transfer-print micro-device wafer system of claim 13, wherein the micro-device comprises one or more inorganic light-emitting diodes.

15. The transfer-print micro-device wafer system of claim 14, wherein the micro-device comprises a device substrate separate from the source wafer and each of the one or more inorganic light-emitting diodes (iLEDs) comprises an iLED substrate separate from the source wafer and the device substrate.

16. The transfer-print micro-device wafer system of claim 14, wherein the micro-device comprises a controller for controlling the one or more inorganic light-emitting diodes.

17. The transfer-print micro-device wafer system of claim 16, wherein the controller comprises a controller substrate separate from the source wafer and the device substrate.

18. The transfer-print micro-device wafer system of claim 16, wherein the one or more test connections are electrically connected to the controller and the controller controls the one or more iLEDs to emit light in response to test signals provided through the one or more test connections.

* * * * *

UNITED STATES PATENT AND TRADEMARK OFFICE
CERTIFICATE OF CORRECTION

PATENT NO. : 10,396,137 B2
APPLICATION NO. : 15/915711
DATED : August 27, 2019
INVENTOR(S) : Ronald S. Cok et al.

It is certified that error appears in the above-identified patent and that said Letters Patent is hereby corrected as shown below:

In the Specification

Column 8, Line 46, please replace:
"SUB"
With:
--SU8--

Signed and Sealed this
Eighth Day of October, 2019

Andrei Iancu
*Director of the United States Patent and Trademark Office*